United States Patent [19]

Chambers

[11] Patent Number: 4,599,574

[45] Date of Patent: Jul. 8, 1986

[54] SELECTABLE GAIN INSTRUMENTATION AMPLIFIER

[75] Inventor: William R. Chambers, Walnut, Calif.

[73] Assignee: Neff Instrument Corporation, Monrovia, Calif.

[21] Appl. No.: 691,709

[22] Filed: Jan. 14, 1985

[51] Int. Cl.$^4$ .......................... H03G 3/30; H03F 3/45
[52] U.S. Cl. ...................................... 330/254; 330/86; 330/282; 330/311
[58] Field of Search ................. 330/86, 254, 282, 311; 367/67

[56] References Cited

U.S. PATENT DOCUMENTS 3,500,316  3/1970  Brown ..................................... 330/86
4,016,557  4/1977  Zitelli et al. ....................... 330/86 X Primary Examiner—James B. Mullins
Attorney, Agent, or Firm—Fraser and Bogucki

[57] ABSTRACT

A high accuracy selectable gain instrumentation amplifier system which avoids amplifying signal distortions produced by gain selection switches includes a high gain amplifier having an input coupled to receive a system input signal and a feedback signal and an output generating an output signal proportional to the difference therebetween, a feedback network providing a plurality of gain selection feedback paths to the amplifier input, a first switching network coupling the amplifier output to a selected feedback path and a second switching network coupling the selected feedback path to the system output. The amplifier system may be implemented in either a differential or single ended ground referenced configuration.

16 Claims, 7 Drawing Figures

SELECTABLE GAIN INSTRUMENTATION AMPLIFIER

BACKGROUND OF THE INVENTION

1. Field of the Invention

This invention relates to a high precision selectable gain instrumentation amplifier system and particularly to a selectable gain instrumentation amplifier which substantially avoids variations in gain resulting from imperfections in gain selection switches.

2. Discussion of the Prior Art

Instrumentation amplifiers must economically provide rapid, high accuracy selection of one of a large range of available gains. As demand for greater performance increases, small nonlinearities in contact characteristics of amplifier gain selection switches become increasingly important. While relays with gold plated contacts are available with excellent, but not perfect, switch contact characteristics, such switches tend to be expensive and slow. To reduce manufacturing costs and increase switching speeds it is preferred to use electronic switches such as field effect transistors. However, these electronic switches tend to have undesirable contact characteristics. For example, a field effect transistor might have an ohmic resistance on the order of 100 ohms and thermally induced offset voltage variations of about 0.1 microvolts per degree centigrade. Such irregularities can introduce substantial error into a low level signal that is to be amplified.

While some offsets can be limited by adjustments, the dictates of rapid initialization and stable operation require that such adjustments be kept to a minimum. Thermally varying offsets are particularly troublesome because no simple adjustment can be utilized to eliminate the offset. While design and component placement techniques can be utilized to provide temperature stability and limit thermal gradients, thermally varying offsets cannot be totally eliminated in commercially practical designs.

Even under preferred packaging and design conditions electrical junctions consisting of different materials such as various metal alloys and silicon produce thermoelectric, thermocouple or Peltier effects. Because all junctions cannot be maintained at precisely the same temperature, these effects produce the small thermoelectric voltages which occur in switches.

SUMMARY OF THE INVENTION

A highly accurate, economical selectable gain instrumentation amplifier system in accordance with the invention is configured to generate an amplified output signal that is substantially independent of amplifier gain selection switches. A multiplexer which functions as a multi-pole gain selection switch is placed in a feed back path between multiple paths of a gain selection resistor network and the output of a high gain amplifier. This arrangement enables gain to be determined by a ratio of high precision resistors and avoids amplification of thermally induced switch offset voltages inherent in the gain selection switches. Thermally varying voltages appearing at the amplifier output are thus kept quite small in comparison to amplified signal voltages.

A high accuracy selectable gain amplifier system in accordance with the invention includes a high gain amplifier having a first differential input coupled to receive a system input signal, a second differential input coupled to receive a feedback signal, and an output, a multiple path gain selection network coupled to provide a feedback signal to the amplifier, a first multiple pole electronic switching network coupling a selected path of the gain selection network to the output of the amplifier and a second multiple pole electronic switching network coupling the selected path of the gain selection network to a system signal output.

The coupling of the system output to the selected path of the gain selection network enables system gain to be determined by the gain selection network with complete independence from imperfections in the first multiple pole switching network. Because an amplified signal is presented to the second multiple pole switching network, any nonlinearities induced by the second multiple pole switching network are small compared to the amplitude of the amplified signal. A high input impedance follower amplifier can be coupled between the second multiple pole switching network and the system output to substantially eliminate any nonlinearities in the amplified system output signal which might result from ohmic impedance in the second multiple pole switching network.

Isolation of imperfections in the first and second switching networks from the system gain is sufficient to enable implementation of the switch networks with integrated circuit multiplexers using MOS-FET transistors. Such multiplexers permit rapid switch of the gain selection network and are relatively inexpensive.

Coupling of the amplifier system to a substantially mirror image of the amplifier system produces a differential amplifier system in which the differential output signal retains the same independence from the switching network contact characteristics as the single ended, ground referenced amplifier system.

A unity gain bridge differential amplifier is coupled to receive the selectable gain amplifier differential output signal and provide a conversion to a single ended ground referenced signal. The ground referenced signal is coupled to instrumentation processing circuitry and also to a buffer amplifier which makes the signal available to user equipment while protecting against short circuits and other loading variations induced by the user equipment.

BRIEF DESCRIPTION OF THE DRAWINGS

A better understanding of the invention may be had from a consideration of the following Detailed Description, taken in connection with the accompanying drawings in which.

DETAILED DESCRIPTION

Figure 1:
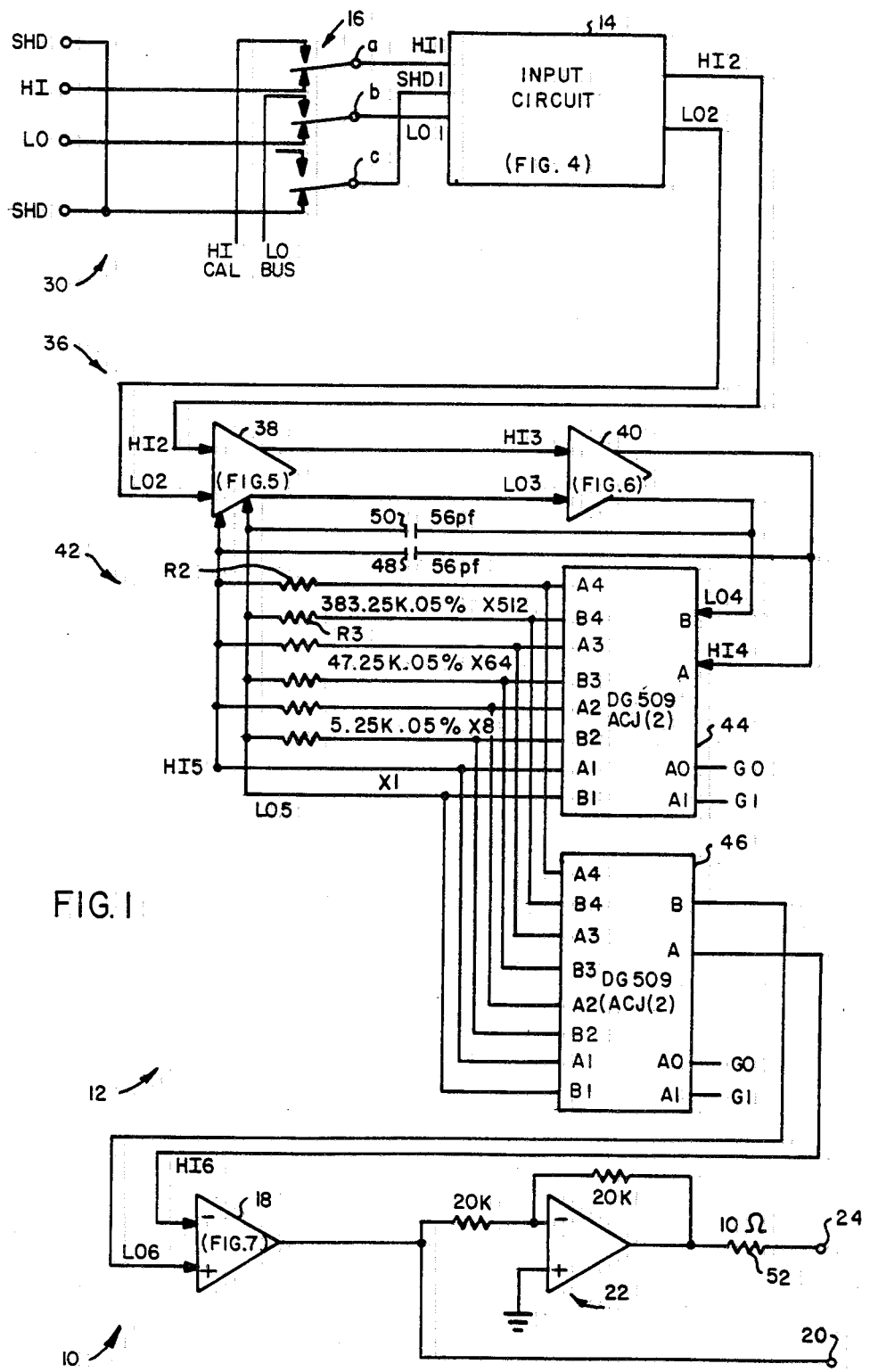
FIG. 1 is a block diagram and schematic representation of a selectable gain instrumentation amplifier system in accordance with the invention.

Referring now to FIG. 1, a high accuracy selectable gain instrumentation amplifier system 10 in accordance with the invention includes a selectable gain amplifier system 12 having a differential input coupled through an input circuit 14 and a relay circuit 16 to system input terminals. A differential output from the selectable gain amplifier 12 is connected to an input of a unity gain bridge differential amplifier 18 which provides a differential to single ended ground referenced signal conversion. The output of amplifier 18 is coupled to a system output terminal 20 and through a buffer amplifier 22 which makes the amplifier output signal available to a system user at a user terminal 24.

Amplifier system 10 of the present invention provides input amplification for one channel of a modular instrumentation system which may have 512 channels in it maximum configuration. The instrumentation system operates on a time division multiplex basis to provide digital output representations of any selected combination of channels in serial sequence.

Input voltage signals are received at a set of 4 terminal connectors 30 providing connection for a high signal, a low signal and shield connections for each of the high and low signals. The shield terminals are coupled together and along with the high and low signals are coupled through the relay 16 to input circuit 14. The relay 16 permits the input circuits to be alternatively coupled to the input terminals 30 or to a high or a low calibration bus. When coupled to the calibration bus, processing circuits downstream of output terminal 20 respond to system 10 output signals generated in response to known voltages placed on the calibration bus to determine what calibration parameters are required to compensate for fixed offset voltages as well as small deviations from the desired gain.

Input circuit 14 is described more fully below in conjunction with FIG. 4, but generally provides a coupling of the shield conductors to ground, provides high frequency common mode filtering, and provides a high impedance coupling of the low input terminal to the shield conductors to avoid the necessity of a user provided ground connection.

The selectable gain amplifier system 12 includes a two stage high gain amplifier 36 having a high input impedance input stage 38 and a low output impedance output stage 40. The selectable gain amplifier system 12 further includes a multipath feedback network 42, a first dual 4 to 1 bidirectional multiplexer switch 44 and second dual 4 to 1 bidirectional multiplexer switch 46.

Figure 2:
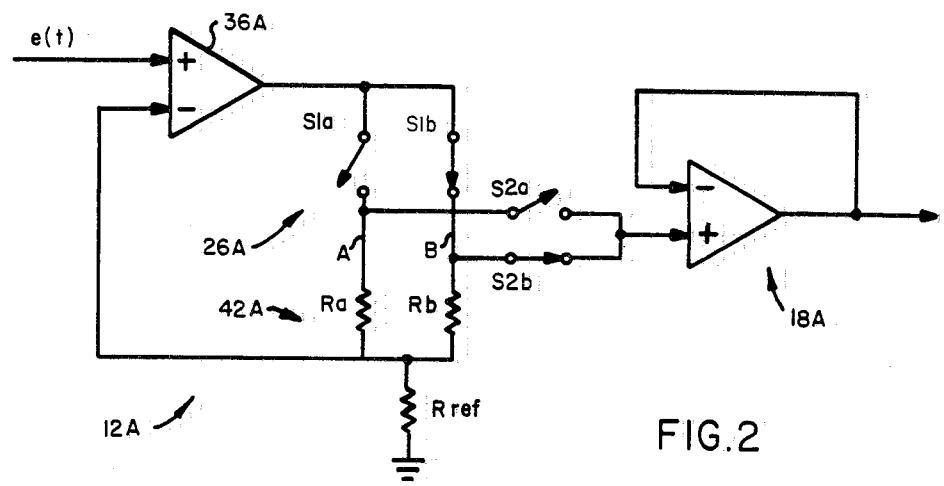
FIG. 2 is a simplified schematic representation of a high accuracy, selectable gain amplifier system in accordance with the invention.

The manner by which amplifier system 12 accurately amplifies the received input signal without distortions resulting from imperfections in the gain selection multiplexer switches 44, 46 is illustrated by the simplified representation of a high accuracy amplifier system 12A in FIG. 2 to which reference is now made. Amplifier system 12A includes a high gain differential amplifier 36A, a multiple path feedback network 42A, an output buffer amplifier 18A, and a multiple path switching network 26A coupling an output of amplifier 36A to a selected path of feedback network 42A and the selected path of the feedback network 42A to the output buffer amplifier 18A.

The gain of the selected amplifier system 12A is determined by the resistors in the multiple path feedback network 42A as, $$\text{gain} = 1 + R_{sp}/R_{ref} \tag{1}$$

where $R_{sp}$ is the selected path resistance $R_a$ or $R_b$ and $R_{ref}$ is the reference resistance coupled between the inverting input to amplifier 36A and ground.

At the input to the selected feedback path the gain is thus accurately a function of only the resistances in the selected feedback path. In the example shown, path B comprising resistance $R_b$ has been selected by closure of switch contacts S1$b$ in a first pair of switch contacts S1$a$, S1$b$. Because of the high gain of amplifier 36A it will drive its output in such a way as to produce a current through resistance $R_{ref}$ which will cause the voltage at the inverting input of amplifier 36A to match the input signal. If the input impedance to amplifier 36A is very large compared to the resistances of feedback network 42A as is typically true, any input current to amplifier 36A can be ignored. The same current must then flow through resistances $R_{ref}$ and $R_b$ and the signal gain appearing at the input to path B of feedback network 42A is represented by Equation (1).

It will be seen that the gain is solely a function of the resistances in the feedback network and independent of any voltage offset across switch contacts S1$b$. The output of amplifier 36A must adjust to reflect any imperfections in the switch contacts, but his adjustment does not appear at the inputs to the paths A and B of the feedback network 42A.

Since the amplified signal appears at the input of a selected one of a plurality of feedback paths, switch network 26A includes a second pair of switch contacts S2$a$ and S2$b$ which couple a selected A or B feedback path to an input to buffer amplifier 18A. Because the second pair of switch contacts are in series with the amplified signal, any imperfection in these contacts will distort the amplified signal. However, the amplitude of the amplified signal will typically be on the order of one volt and the distortions introduced by switch contacts S2$a$ or S2$b$ will be quite small by comparison.

If a buffer amplifier 18A is implemented with a very high impedance FET input, then the current through the selected switch S2$a$ or S2$b$ will be very small and the ohmic voltage appearing across the closed switch contacts will be negligible. In addition, the thermally induced offset voltage across the selected switch contacts will have a fixed offset component plus a smaller component which varies with temperature. The fixed offset component can be compensated using conventional calibration techniques (not shown) and, if necessary, the thermally varying component can be controlled by thermal stabilization of the switch contacts.

The amplifier system 12, 12A is thus capable of generating an amplified output signal having a precisely selected gain which very accurately represents the input signal.

Figure 3:
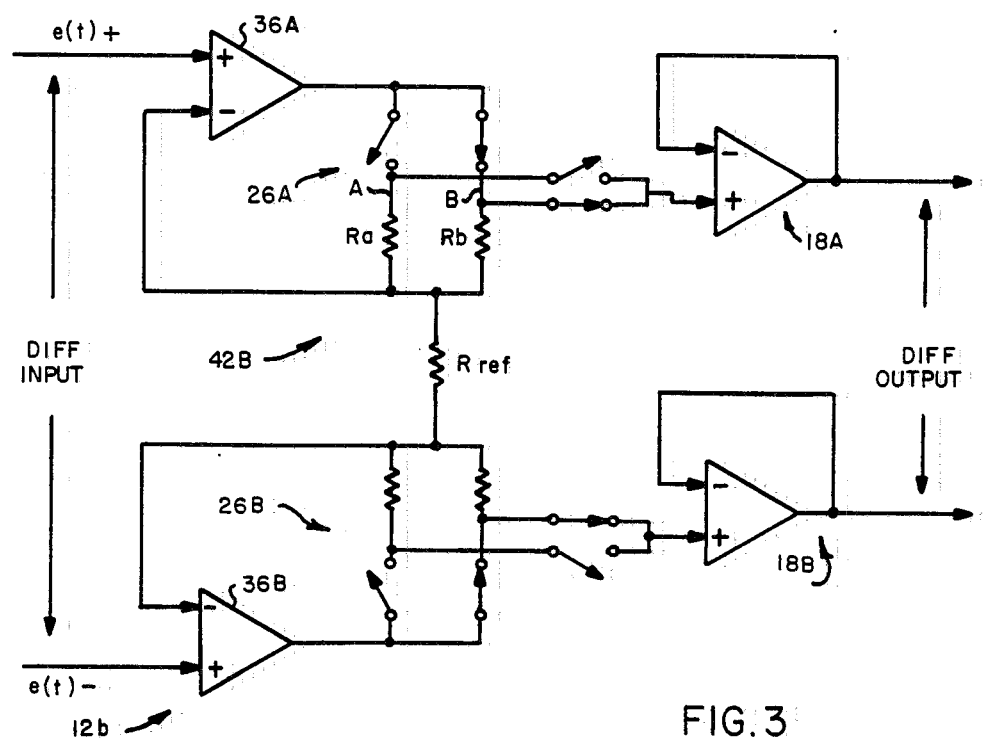
FIG. 3 is a simplified schematic representation of a high accuracy, selectable gain differential amplifier system in accordance with the invention.

A differential amplifier system 12B shown in FIG. 3 is a differential version of the ground referenced amplifier system 12A shown in FIG. 2. It is essentially constructed by coupling the resistance $R_{ref}$ of amplifier system 12A to a mirror image of amplifier system 12A instead of to ground.

Operation of amplifier system 12B is essentially the same as operation of amplifier system 12A except that two outputs must be taken from two inputs to selected feedback paths in feedback network 42B by two multi-path switch networks 26A, 26B and coupled to two buffer amplifiers 18A, 18B respectively. In equation (1) the gain is determined by letting resistance Rsp be the sum of the resistances in the two selected feedback paths.

Referring again to the complete instrumentation amplifier system 10 shown in FIG. 1, the input stage 38 of two stage amplifier 36 receives as signal inputs high and low signals from input circuit 14 designated HI2 and LO2 respectively. Input stage 38 also receives as feedback inputs high and low feedback signals designated HI5 and LO5 respectively which are subtracted from the respective high and low input signals to generate respective high and low first stage output signals generated HI3 and LO3 respectively. The output amplifier stage 40 receives the high and low signals HI3, LO3, amplifies them, and outputs high and low signals HI4, LO4 respectively in response thereto. The high gain amplifier 36 formed by input stage 38 and output stage 40 should have a total gain in excess of 1000 for high quality circuit operation and in the present instance has a total gain of approximately 10,000.

Each of the multiplexers 44, 46 may be of type DG509 ACJ(2) which includes MOS-FET transistors selectively connecting a first A terminal to one of four second A terminals designated A1–A4 and a first B terminal to one of four second B terminals designated B1–B4 in response to address selection signals at address inputs A0, A1. The address inputs A0, A1 are connected to address selection signals G0, G1 generated by processor circuitry which is not shown to select the gain of the selectable gain amplifier system 12 by establishing a path between a first A terminal and a second A terminal and a path between the B terminal and a second B terminal.

The feedback network 42 includes four high signal feedback paths coupled to high signal feedback input HI5 and four low signal feedback paths coupled to low signal feedback input LO5. Corresponding pairs of the four feedback paths are identical for the high and low circuits to form matched pairs and determine the gain of the selectable gain amplifier system 12. The four paths connect to the four second terminals of multiplexer 44 to permit selection of one of four predetermined amplifier gains.

A first path of feedback network 42 is a short circuit path connecting input LO5 to multiplexer terminal B1 and input HI5 to multiplexer terminal A1 to provide units gain when the A1, B1 terminals are connected to the A terminals in response to address selection signals G0, G1.

The second paths of feedback network 42 include 5.25 K (0.05%) resistors connected between high feedback signals HI5 and terminal A2 and between low feedback signal LO5 and terminal B2 respectively. They provide selectable gain amplifier 12 with a gain of approximately 8.

The third feedback path of feedback network 42 includes 47.25 K (0.05%) resistors coupled between input HI5 and terminal A3 and between input LO5 and terminal B3 respectively to provide a nominal gain of 64. Resistances of 383.25 K (0.05%) are connected between feedback input signal HI5 and terminal A4 and input LO5 and terminal B4 respectively to provide a nominal gain of 512. It is thus seen that in response to input address signals G0, G1, multiplexer 44 selects the connection path between the high and low first terminals A, B and one of the second terminals A1 to A4, B1 to B4 respectively to establish a selected gain for the selectable gain amplifier 12 which may be changed by the associated processor by changing address signals G0, G1.

A pair of 56 micro farad frequency compensation capacitors 48, 50 extend between the high and low feedback signals HI5, LO5 and the high and low second stage output signals HI4 and LO4 respectively to limit high frequency gain and prevent unwanted oscillation of the selectable gain amplifier 12.

The second multiplexer 46 operates to tap the outputs of selectable gain amplifier system 12 at the junction of the feedback path impedances of feedback network 42 and the second terminals A1-A4, B1-B4 of multiplexer 44. At this point the outputs exactly represent the desired gain without uncertainties imposed by the variable influences of the first multiplexer 44. The multiplexers 44, 46 have internal impedances in the selected current paths which are difficult to predict but which are on the order of 3 to 60 ohms as well as thermally induced and variable offset voltages on the order of 10 microvolts. By taking the amplifier outputs from points between the second terminals of multiplexer 44 and the feedback impedances of feedback network 42, these variable factors are totally eliminated with respective to multiplexer 44. At the same time, the A and B terminals of multiplexer 46 connect to a high input impedance amplifier 18 through high and low selectable gain amplifier output signals HI6, LO6 respectively so that very little current flows through multiplexer 46. As a result, the internal impedance of multiplexer 46 has very little effect upon the voltage signals HI6, LO6.

The gain of selectable gain amplifier system 12 can be analyzed in greater detail by noting that input stage 38 places a precision 1.5 K ohm resistor which will be referred by as Rref (See FIG. 5) between the feedback signals HI5 and LO5. Amplifier system 12 then drives its output in a manner which tends to force a feedback current through R1 to produce a voltage across R1 which matches the input voltage across input signals HI2, LO2. Using the fourth feedback path by way of example, if the feedback resistance between the high feedback path HI5 and the output connection is designated R2 and the low feedback resistance between low feedback path LO5 and the output connection is designated R3 then the sum of the selected feedback path resistances is R2+R3. Looking at the fourth feedback path in the present example, R2 and R3 each have a value of 383.25 K. When added together and divided by Rref=1.5 K the result is 511. Using equation (1), the total gain of selectable gain amplifier 12 when the fourth feedback path is selectable is therefor 1+511=512 as desired.

Amplifier 18 operates as unity gain buffer amplifier to afford a high input impedance to signals HI6, LO6 to avoid the requirement for substantial currents through multiplexer 16 which would effect the gain of the amplified output signal HI6, LO6 from selectable gain amplifier 12. Amplifier 18 also provides a double ended to single ended ground referenced conversion with a relatively low output impedance for driving terminal 20 to which connects processing circuitry for other portions of the instrumentation amplifier system. These other portions are not shown and are not pertinent to the instrumentation amplifier system 10 of the present invention. Amplifier 22 similarly provides an independence buffered unity gain amplification through a 10 ohm series impedance 52 to a user available terminal 24 while protecting against short circuits and other user induced faults which might affect the operation of the amplifier system 10.

Figure 4:
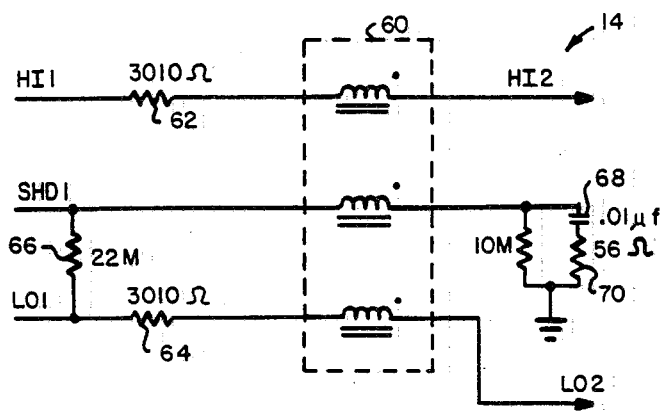
FIG. 4 is a schematic diagram representation of an input circuit used in the amplifier system shown in FIG. 1.

Referring now to FIG. 4, it will be seen that input circuit 14 includes a trifiler magnetic core transformer 60 having three separate windings connected in series with the three input signals HI1, SHD1, and LO1. 3010 ohm input impedances 62, 64 are also connected in series between the respective input signals HI1, LO1 and the corresponding transformer windings. A 22 meg ohm resistor 66 provides a high impedance resistive path between input signal LO1 and and shield input SHD1 to provide a high impedance coupling of signal LO1 to ground to avoid the requirement for a user to provide a user ground connection while avoiding loading of the input terminal LO1. On the output side of transformer 60 shield signal SHD1 is grounded through a 10 meg ohm resistor which provides a high impedance ground coupling for low frequency signals of interest and also through a series combination of a 0.01 microfarad capacitor 68 and a 56 ohm resistor 70 which provide a relatively low impedance path to ground for high frequency signals beyond frequencies of interest for instrumentation purposes.

Figure 5:
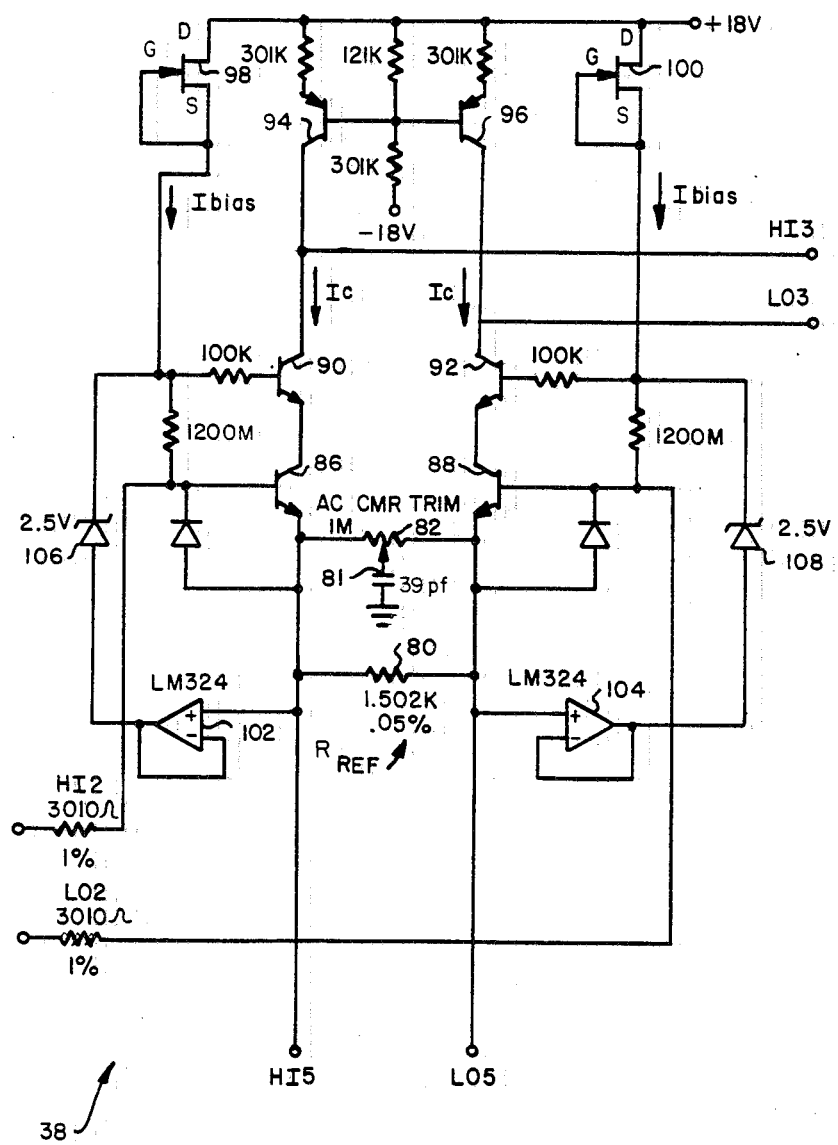
FIG. 5 is a schematic representation of a first amplifier stage for the amplifier system shown in FIG. 1.

FIG. 5 illustrates in greater detail the input stage amplifier 38 which presents a very high input impedance to received high and low input signals on signal lines HI2, LO2. As noted previously, input stage amplifier 38 operates to produce output signals tending to induce a voltage across feedback input signals HI5, LO5 which exactly matches the differential voltage across input signals HI2, LO2. The resistance interconnecting feedback signals HI5 and LO5 which previously was referred to as a resistance Rref is actually implemented as a parallel combination of a 1.502 K ohm resistor 80 and a 1 meg ohm potentiometer 82 having a center tap terminal which is connected through a 38 picofarad capacitance to ground to provide trimming of AC common mode rejection for the input stage amplifier 38. The parallel combination of the 1 meg ohm resistance and 1.502 K ohm resistance provide the 1.500 K ohm resistance previously referred to as Rref.

The construction of the input stage 38 is generally conventional in nature and includes a matched pair of grounded emitter transistors 86, 88 having their bases coupled through 3010Ω ohm coupling resistors to the respective input signals HI2, LO2. The collectors of transistors 86, 88 are connected to the emitters of a matched pair of grounded base transistors 90, 92 respectively which in turn have their collectors connected to the output signals HI3, LO3 as well as a pair of current source transistors 94, 96. A pair of JFET transistors 98, 100 provide a current source for biasing the transistors 86, 88 and 90, 92. Unity gain differential amplifiers 102, 104 have a high input impedance connected to feedback signals HI5, LO5 respectively and outputs coupled through 2.5 volt Zener diodes 106, 108 and 100 K ohm resistances to the bases of transistors 90, 92. The bases of transistors 90, 92 are thus constrained to fixed offset voltages relative to the feedback input signals HI5, LO5. As a consequence, any difference between the voltage across the feedback input signals HI5, LO5 and the input signals HI2, LO2 is amplified and output as the differential output signal HI3, LO3.

Figure 6:
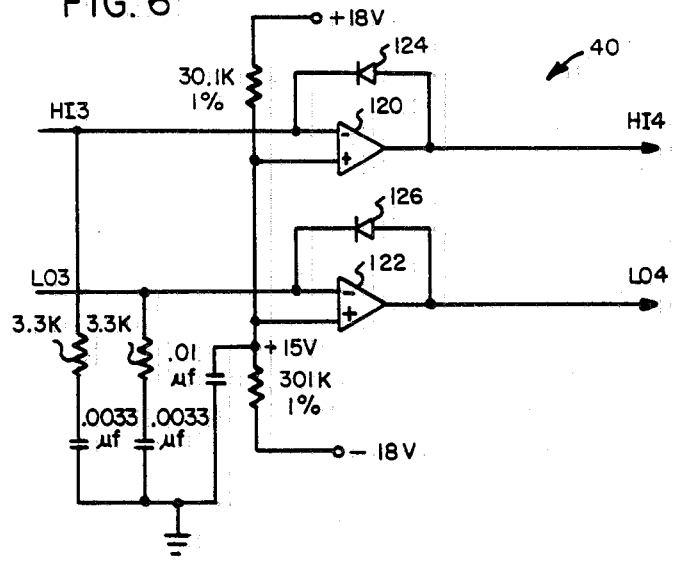
FIG. 6 is a schematic representation of a second amplifier stage of the amplifier system shown in FIG. 1.

Illustrated in FIG. 6 is the output stage amplifier 40 which receives the first stage amplified differential signals HI3, LO3 and provides further amplification to generate the output stage amplified signals HI4, LO4. Amplifier stage 40 includes a pair of inverting differential amplifiers 120, 122 which may be of type LF355B. The negative inputs of differential amplifiers 120, 122 are connected to the input signals HI3, LO3 respectively while the outputs provide signals HI4, LO4. The positive inputs are connected to a voltage divider consisting of 30.1 K and 301 K ohms connected in series between +18 volts and −18 volts to provide a 15 volt reference level. This 15 volt reference level corresponds to a 15 volt DC common mode voltage level for the received input signals HI3, LO3 from input stage 38. The outputs of differential amplifiers 120, 122 drive output signals HI4, LO4 and are also coupled through diodes 124, 126 to the respective negative inputs. The diodes 124, 126 operate to prevent a latch up of the selectable gain amplifier circuit 12 under certain extreme conditions. Frequency compensation is provide by coupling each of the input signals HI3, LO3, to ground through the series combination of a 3.3 K ohm resistance and a 0.0033 microfarad capacitance. A 0.01 microfarad bypass capacitor stabilizes the 15 volt reference point for the positive inputs to amplifier 120, 122.

Figure 7:
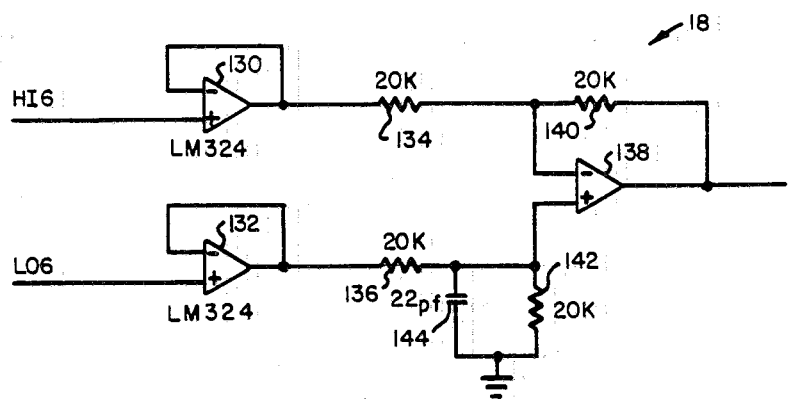
FIG. 7 is a schematic diagram representation of a unity gain bridge differential amplifier used in the amplification system shown in FIG. 1.

The unity gain bridge differential amplifier 18 is shown in greater detail in FIG. 7. A pair of noninverting differential amplifiers 130, 132 of type LM324 are coupled to receive and buffer the output signals HI6, LO6 from selectable gain amplifier 12. The outputs of amplifiers 130, 132 are coupled through 20 K ohm coupling resistances 134, 136 to the respective positive and negative inputs of a differential amplifier 138 of type LF355B. The output of amplifier 138 is coupled through a 20 K ohm unity gain feedback resistance 140 to the negative input thereof while frequency compensation is provided by coupling the positive input to ground through the parallel combination of a 20 K ohm resistor 142 and a 22 picofarad capacitor 144.

While there has been shown and described above a selectable gain instrumentation amplifier system for the purpose of enabling a person of ordinary skill in the art to make and use the invention, it will appreciated that the invention is not limited thereto. Accordingly, any modifications, variation or equivalent arrangements within the scope of attached claims should be considered to be within the scope of the invention.

What is claimed is:

1. A selectable gain amplifier system comprising:
a pair of high gain amplifiers, each having a noninverting input coupled to receive a different part of a two part differential system input signal and an inverting input coupled to receive a different part of a two part differential feedback signal and an output generating a different part of a two part differential output amplifier signal;
a pair of multiple path feedback networks, each coupled to provide the feedback signal to the inverting input of a different one of the high gain amplifiers in response to a signal coupled to a selected one of the multiple paths, the feedback signal tending to cause the respective high gain amplifier to generate an amplifier output signal which, when coupled to the selected feedback path, is an accurate representation of the input signal with an amplification determined by the selected feedback path; and
a pair of multiple pole switching networks, each coupled to provide communication between the output of a different one of the high gain amplifiers and the selected feedback path coupled thereto and between the selected feedback path and an output of the amplifier system.

2. The selectable gain amplifier system according to claim 1 above, wherein each high gain amplifier is a differential amplifier generating a different part of a two part differential output signal having a selected voltage gain relative to the differential system input signal and wherein the multiple path feedback networks contain a plurality of corresponding parallel paths having substantially identical impedances.

3. The selectable gain amplifier system according to claim 1 above, wherein the amplifier system is an instrumentation amplifier system and wherein each of the high gain amplifiers is a two stage amplifier having a high input impedance input stage and a low output impedance output stage.

4. A selectable gain amplifier system comprising:
a high gain amplifier having a high input impedance input stage with an input coupled to receive a system input signal and a feedback signal and a low output impedance output stage with an output generating an amplifier output signal, the input stage comprising a matched pair of common base transistors and a matched pair of common emitter transistors having their emitters coupled to differential feedback signals, having bases coupled to receive differential input signals and having collectors coupled respectively to emitters of the matched pair of common base transistors, the common base transistors having collectors providing input stage differential outputs;
a multiple path feedback network coupled to provide the feedback signal to the input of the high gain amplifier in response to a signal coupled to a selected one of the multiple paths, the feedback signal tending to cause the high gain amplifier to generate an amplifier output signal which, when coupled to the selected feedback path, generates at the selected feedback path an accurate representation of the input signal with an amplification determined by the selected feedback path; and
a multiple pole switching network coupled to provide communication between the output of the high gain amplifier and the selected feedback path and between the selected feedback path and an output of the amplifier system.

5. The selectable gain amplifier system according to claim 4 above, further comprising a current source coupled to supply currents to the respective collectors of the pair of common base transistors.

6. The selectable gain amplifier system according to claim 4, above, wherein the output stage comprises a pair of unity gain amplifiers, each coupled to drive a different differential output of the high gain amplifier.

7. A selectable gain differential instrumentation amplifier system comprising:
a high gain differential amplifier having a two part differential signal input coupled to receive a two part differential input signal and present a high input impedance to a source of the differential input signal and a two part differential feedback input coupled to receive a two part differential feedback signal and an output generating a two part differential output signal having a difference proportional to any differential difference between the input signal and the feedback signal;
a feedback network having a plurality of pairs of substantially identical paths with first ends coupled respectively to the two parts of the differential feedback input of the high gain amplifier to provide thereto the differential feedback signals and second ends opposite the first ends;
a first multiplexer responsive to a gain selection signal and coupled to establish circuit paths between each part of the differential output signals from the high gain differential amplifier and respective second ends of a particular path pair of the feedback network indicated by a gain selection signal to select one of a plurality of different gains;
a second multiplexer responsive to the gain selection signal and coupled to establish circuit paths between a pair of first terminals thereof providing differential output signals and the respective second ends of the particular path pair of the feedback network indicated by the gain selection signal.

8. The selectable gain differential amplifier system according to claim 7 above, further comprising a high input impedance buffer amplifier coupled to receive and buffer the differential signals provided at the first terminals of the second multiplexer.

9. The selectable gain differential amplifier system according to claim 8 above, wherein one of the path pairs in the feedback network is substantially a short circuit and causes the amplifier system to have a unity gain when established as a circuit path by the first multiplexer.

10. The selectable gain differential amplifier system according to claim 8 above, wherein the high input impedance buffer amplifier is a bridge differential amplifier providing a conversion from received differential signals to a single ended ground referenced output signal.

11. A precision gain instrumentation amplifier system providing a system output signal having a selectable gain relative to a differential system input signal, the amplifier system comprising:
a high gain differential amplifier means coupled to generate a differential amplifier output signal proportional to a difference between the system input signal and a feedback signal;
a feedback network having a plurality of matched pairs of parallel feedback paths, each path having first and second ends with a first end connected to provide a component of the feedback signal to the high gain amplifier means, each pair of feedback paths including a different pair of gain controlling impedances between the respective first and second ends of each pair of paths selected to provide the amplifier circuit with a particular selectable gain, one of the gain controlling impedances being a short circuit and providing a gain of one when selected;
a first multiplexer coupled to complete a relatively low impedance circuit path between the amplifier output signal and a pair of second ends of a particular corresponding pair of feedback paths determined in response to a received gain selection signal; and
a second multiplexer coupled to complete a relatively low impedance circuit path coupling the system output signal to the pair of second ends of the particular pair of feedback paths determined in response to the received gain selection signal.

12. The instrumentation amplifier circuit according to claim 11 above, further comprising a high input impedance buffer amplifier coupled to communicate the system output signal between the second multiplexer and a system output.

13. A selectable gain differential amplifier system comprising:
- a high gain differential amplifier having noninverting, high input impedance inputs coupled to receive a differential input signal and having an inverting input coupled to receive a differential feedback signal and generating an amplified differential output signal that is proportional to a difference between the input signal and the feedback signal;
- a feedback network coupled to provide the feedback signal to the high gain amplifier, the feedback network including a plurality of different matched pairs of feedback paths, each pair of feedback paths providing a different gain for the selectable gain amplifier;
- a first multiplexer coupled to the high gain amplifier output signal and to each different feedback path of the feedback network, the first multiplexer being responsive to a received gain selection signal to couple the amplifier output signal to a respective pair of feedback paths indicated by the received gain selection signal; and
- a second multiplexer coupled to each different feedback path of the feedback network, the second multiplexer receiving the gain selection signal and being responsive thereto to couple to the selectable gain amplifier system output the pair of feedback paths indicated by the gain selection signal.

14. A selectable gain amplifier system comprising:
- first and second high gain amplifiers, each having a noninverting input coupled to receive a different signal component of a differential system input signal and an inverting input coupled to receive a different signal component of a differential feedback signal, and generate an amplified differential output signal proportional to the difference between the received components of the system input signal and the feedback signal;
- first and second switch networks coupling the output signal from the first and second high gain amplifier respectively to a selected one of a plurality of first and second switch output terminals respectively;
- a feedback path network having a plurality of gain selection feedback paths determining the gain of the amplifier system, the feedback paths including a first plurality of input paths coupled respectively between the first plurality of switch output terminals and the inverting input to the first amplifier, a second plurality of input paths which are substantially identical to the first plurality of input paths and which are coupled respectively between the second plurality of switch output terminals and the inverting input to the second amplifier; and
- third and fourth switch networks coupling first and second components respectively of the amplified differential output signal from the selected one of the plurality of first and second switch output terminals respectively to a differential system output.

15. The selectable gain amplifier system according to claim 14 wherein the feedback path network includes a first plurality of resistances which are each different from the other coupled respectively between the first plurality of switch output terminals and the feedback input of the first amplifier, a second plurality of resistances matching the first plurality of resistances coupled respectively between the second plurality of switch output terminals and the feedback input of the second amplifier and a reference resistance coupled between the feedback input of the first amplifier and the feedback input of the second amplifier.

16. The selectable gain amplifier system according to claim 14 above, wherein the first, second, third and fourth switch networks are each electronic switch networks that are operative to couple a selected one of a plurality of input terminals to an output terminal in response to a gain selection signal.

* * * * *